(12) United States Patent
Ueda (10) Patent No.: US 11,207,994 B2
(45) Date of Patent: Dec. 28, 2021

(54) MECHANO-ELECTRICAL INTEGRATED POWER CONVERSION DEVICE AND DRIVE DEVICE FOR ELECTRIC AUTOMOBILE

(71) Applicant: KEIHIN CORPORATION, Tokyo (JP)

(72) Inventor: Masashi Ueda, Kakuda (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 17/024,052

(22) Filed: Sep. 17, 2020

(65) Prior Publication Data

US 2021/0086635 A1    Mar. 25, 2021

(30) Foreign Application Priority Data

Sep. 20, 2019 (JP) .............................. JP2019-171240

(51) Int. Cl.
| | |
|---|---|
| *B60L 53/22* | (2019.01) |
| *B60L 3/00* | (2019.01) |
| *B60R 16/023* | (2006.01) |
| *H05K 7/14* | (2006.01) |
| *H05K 7/20* | (2006.01) |

(52) U.S. Cl.
CPC ............ *B60L 53/22* (2019.02); *B60L 3/0061* (2013.01); *B60R 16/0231* (2013.01); *H05K 7/1432* (2013.01); *H05K 7/209* (2013.01); *H05K 7/20927* (2013.01); *B60L 2210/10* (2013.01)

(58) Field of Classification Search
CPC .... H05K 7/1432; H05K 7/209; B60L 15/007; B60L 3/0069; B60L 2210/10; B60L 53/22; Y02T 10/72; Y02T 90/14; Y02T 10/64; B60R 16/0231
See application file for complete search history.

(56) References Cited

U.S. PATENT DOCUMENTS

| | | | |
|---|---|---|---|
| 2012/0063176 A1* | 3/2012 | Yamasaki | ............. B60L 15/007 363/34 |
| 2013/0051108 A1* | 2/2013 | Nagao | ................ H05K 7/20927 363/141 |

(Continued)

FOREIGN PATENT DOCUMENTS

| | | |
|---|---|---|
| CN | 110154715 A | 8/2019 |
| JP | H07-156826 A | 6/1995 |

*Primary Examiner* — Jared Fureman
*Assistant Examiner* — Duc M Pham
(74) *Attorney, Agent, or Firm* — Carrier Blackman & Associates, P.C.; Joseph P. Carrier; William D. Blackman (57) ABSTRACT

A mechano-electrical integrated power conversion device includes power drive unit and voltage converter that are housed within a single housing box and formed as a module. The box includes box body, upper lid member, and side lid member. The box body includes: a box body main portion disposed above a casing of an electric motor; and a box body remainder portion connected integrally to a side wall of the box body main portion and extending downwardly to a side of the casing. The upper lid member is mounted on the box body main portion, a first housing chamber being defined therebetween and housing the power drive unit. The side lid member is mounted on a side open end part of the box body remainder portion, a second housing chamber being defined between the box body remainder portion and the side lid member and housing the voltage converter.

5 Claims, 5 Drawing Sheets

(56) References Cited

U.S. PATENT DOCUMENTS

2013/0128643 A1* 5/2013 Shinohara .......... H05K 7/20927
  363/131
2018/0132388 A1* 5/2018 Hayashi ............. H05K 7/20254
2018/0174934 A1* 6/2018 Tani ........................ H01L 23/13

* cited by examiner

MECHANO-ELECTRICAL INTEGRATED POWER CONVERSION DEVICE AND DRIVE DEVICE FOR ELECTRIC AUTOMOBILE

CROSS REFERENCE TO RELATED APPLICATIONS

The present application claims priority under 35 U.S.C. § 119 to Japanese Patent Application No. 2019-171240 filed Sep. 20, 2019 the entire contents of which are hereby incorporated by reference.

BACKGROUND OF THE INVENTION

Field of the Invention

The present invention relates to a mechano-electrical integrated power conversion device comprising a voltage converter and a power drive unit that controls operation of an electric motor, the voltage converter and the power drive unit being housed in an interior of a single housing box and formed as a module. The present invention also relates to a drive device for an electric automobile using the mechano-electrical integrated power conversion device.

Description of the Related Art

Japanese Patent Application Laid-open No. H07-156826 has made known a structure in which a high voltage electric module body is formed by assembling and integrating a power drive unit and a down converter in a layered state, and the high voltage electric module body is disposed above an electric motor and a transmission.

In the arrangement disclosed by Japanese Patent Application Laid-open No. H07-156826, the overall height when the high voltage electric module body is assembled onto the electric motor is large, and when the electric motor is housed in a motor compartment of an electric automobile, the clearance between the high voltage electric module body and a hood becomes small.

SUMMARY OF THE INVENTION

The present invention has been accomplished in light of such circumstances, and it is an object thereof to provide a mechano-electrical integrated power conversion device that enables the overall height, including an electric motor, when mounted on a casing of the electric motor to be minimized, and a drive device for an electric automobile that desirably employs the mechano-electrical integrated power conversion device.

In order to achieve the object, according to a first aspect of the present invention, there is provided a mechano-electrical integrated power conversion device comprising a voltage converter and a power drive unit that controls operation of an electric motor, the voltage converter and the power drive unit being housed in an interior of a single housing box and formed as a module, wherein the housing box comprises a box body, an upper lid member, and a side lid member, the box body including a box body main portion and a box body remainder portion, the box body main portion being disposed above a casing of the electric motor and forming an upper open end part opening upwardly, the box body remainder portion forming a side open end part opening sidewardly and being connected integrally to a side wall of the box body main portion so as to extend downwardly to a side of the casing, the upper lid member being mounted on the upper open end part of the box body main portion and a first housing chamber being defined between the box body main portion and the upper lid member, the first housing chamber housing the power drive unit, and the side lid member being mounted on the side open end part of the box body remainder portion and a second housing chamber being defined between the box body remainder portion and the side lid member, the second housing chamber housing the voltage converter.

In accordance with the first aspect of the present invention, since the power drive unit and the voltage converter are disposed in a dispersed manner above the electric motor and to the side of the electric motor, it becomes possible to minimize the overall height, including the electric motor, when mounted on the casing of the electric motor and, moreover, since the power drive unit and the voltage converter are housed within the single housing box, any increase in the number of components is suppressed.

According to a second aspect of the present invention, in addition to the first aspect, a cooling jacket comprises the box body remainder portion and a heat-dissipating lid body mounted on the box body remainder portion so as to partition off part of the second housing chamber, and the voltage converter is housed within the second housing chamber so as to be in contact with the heat-dissipating lid body.

In accordance with the second aspect of the present invention, since the voltage converter is housed within the second housing chamber while being in contact with the heat-dissipating lid body forming the cooling jacket in cooperation with the box body remainder portion, the power drive unit, the voltage converter, and the cooling jacket can be efficiently housed within the single housing box without increasing the overall height of the power conversion device, thus enabling the voltage converter to be efficiently cooled.

According to a third aspect of the present invention, in addition to the first aspect, the box body main portion and the box body remainder portion are formed by die-cast integrated molding with the casing.

In accordance with the third aspect of the present invention, since the box body main portion and the box body remainder portion are formed by die-cast integrated molding with the casing, the upper wall of the casing serves as the bottom part of the first housing chamber housing the power drive unit, and it is possible to omit fastening screws, air-tight members, etc., thus suppressing any increase in the number of components and enabling the weight of the power conversion device including the electric motor to be lightened.

According to a fourth aspect of the present invention, in addition to the third aspect, a stator terminal block of the electric motor is provided on, and a rotation angle detection device detecting a rotational state of a rotating shaft of the electric motor is mounted on, an end wall of the casing on one end side in an axial direction of the rotating shaft, an opening communicating with the first housing chamber is provided in an upper wall of the casing close to the end wall in the axial direction of the rotating shaft, and power wires and a signal wire extend through the opening and are guided into the first housing chamber, the power wires being mounted on the stator terminal block together with three-phase lead wires and the signal wire being connected to the rotation angle detection device.

In accordance with the fourth aspect of the present invention, since the power wire connected to the three-phase lead wire of the electric motor and the signal wire connected to the rotation angle detection device extend through the opening provided in the upper wall of the casing and are introduced into the first housing chamber between the box body main portion and the upper lid member, it is possible to prevent the high voltage power wire from being exposed to the outside and to enhance the safety by making it difficult for unforeseen electrical leakage to occur under circumstances in which the electric automobile is involved in a collision, and due to the necessity for a waterproof coupler, etc. being eliminated, the cost can be reduced.

According to a fifth aspect of the present invention, there is provided a drive device for an electric automobile, comprising as a drive source the electric motor of the mechano-electrical integrated power conversion device according to the first aspect, wherein at least a part of a transmission operatively linked to the rotating shaft of the electric motor is disposed in parallel to a side of the casing so that an axis of an output shaft of the transmission is parallel to a rotational axis of the electric motor, and the box body remainder portion and the side lid member are disposed between the casing and the part of the transmission when viewed from above.

In accordance with the fifth aspect of the present invention, since at least part of the transmission is disposed in parallel with the electric motor, and the box body remainder portion and the side lid member are disposed between the electric motor and a portion of the transmission that is disposed to the side of the electric motor, in spite of the voltage converter being disposed to the side of the electric motor it is possible to make the drive device for an electric automobile compact.

Note that motor generators 11A, 11B of embodiments correspond to the electric motor of the present invention, a second cooling jacket 32 of the embodiments correspond to the cooling jacket of the present invention, a resolver 41 of the embodiments correspond to the rotation angle detection device of the present invention, and a fourth opening 50 of the embodiments correspond to the opening of the present invention.

The above and other objects, characteristics and advantages of the present invention will be clear from detailed descriptions of the preferred embodiments which will be provided below while referring to the attached drawings.

BRIEF DESCRIPTION OF THE DRAWINGS

FIG. 3 is a partial cutaway front view of a motor generator with part of a casing cut away in a state in which an end part cover is removed.

DESCRIPTION OF THE PREFERRED EMBODIMENTS

Embodiments of the present invention are explained by reference to the attached drawings.

A first embodiment of the present invention is explained by reference to FIG. 1 to FIG. 4; first, in FIG. 1, a mechano-electrical integrated drive device for an electric automobile is mounted in an electric automobile (electric vehicle), and includes a motor generator 11A as an electric motor that functions as a drive source exerting drive power, and a transmission 12 that transmits power from the motor generator 11A.

A motor cooling part, which is not illustrated, is provided within a casing 13 of the motor generator 11A, and a rotating shaft 14 of the electric motor 11A is rotatably supported by the casing 13. The transmission 12 has a reduction gear mechanism that includes a pair of output shafts 15 parallel to the axis of the rotating shaft 14, that is, the rotational axis of the motor generator 11A, and is operatively linked to one end part of the rotating shaft 14. A transmission case 16 of the transmission 12 is connectedly provided on the casing 13 of the motor generator 11A on one end side of the rotating shaft 14. The transmission case 16 includes an inner case half body 16a connectedly provided on the casing 13, and an outer case half body 16b covering an open end of the inner case half body 16a on the one end side of the rotating shaft 14, and the inner case half body 16a has a protruding portion 16aa disposed in close proximity to the side of the casing 13.

In order to distribute the power of the motor generator 11A between a pair of left and right driven wheels of the vehicle, a differential gear mechanism (differential gear), which is not illustrated, is housed in the protruding portion 16aa of the inner case half body 16a so as to be connected to the pair of output shafts 15, and the protruding portion 16aa is disposed in parallel with the motor generator 11A.

One output shaft 15 of the pair of output shafts 15 is rotatably supported on the transmission case 16 while part of the one output shaft 15 faces a protruding end of the protruding portion 16aa of the inner case half body 16a, and the other output shaft 15 is rotatably supported on the transmission case 16 while part of the other output shaft 15 faces the outside from the outer case half body 16b so as to be coaxial with the one output shaft 15. A drive shaft (not illustrated) for transmitting power toward driven wheels suspended swingably in the up-down direction on the vehicle via a suspension device, which is not illustrated, is linked to these output shafts 15.

A housing box 17 is disposed on the casing 13 of the motor generator 11A. The housing box 17 is formed from a box body 18 connectedly provided on the casing 13, and an upper lid member 19 and side lid member 20 mounted on the box body 18. The box body 18 is formed from a box body main portion 18a and a box body remainder portion 18b, the box body main portion 18a being disposed above the casing 13, the box body remainder portion 18b opening sidewardly, being connected integrally to a side wall of the box body main portion 18a and extending downwardly to the side of the casing 13.

The upper lid member 19 is mounted on an upper open end part of the box body main portion 18a, a first housing chamber 21 being defined between the box body main portion 18a and the upper lid member 19, and the side lid member 20 is mounted on a side open end part of the box body remainder portion 18b, a second housing chamber 22 being defined between the box body remainder portion 18b and the side lid member 20.

The box body 18, which is formed from the box body main portion 18a and the box body remainder portion 18b, is preferably molded integrally with the casing 13 by for example a so-called die cast method in which molding is carried out by injecting a molten aluminum alloy material into a mold. A bottom part of the first housing chamber 21 housing a power drive unit 28, which is described later, etc. also functions as an upper wall of the casing 13, and compared with a case in which a box body that is a member separate from the casing 13 is mounted on the casing 13, it is possible to reduce the number of components by simplifying fastening screws, air-tight members, etc. and to lighten the weight of a power conversion device.

Figure 2:
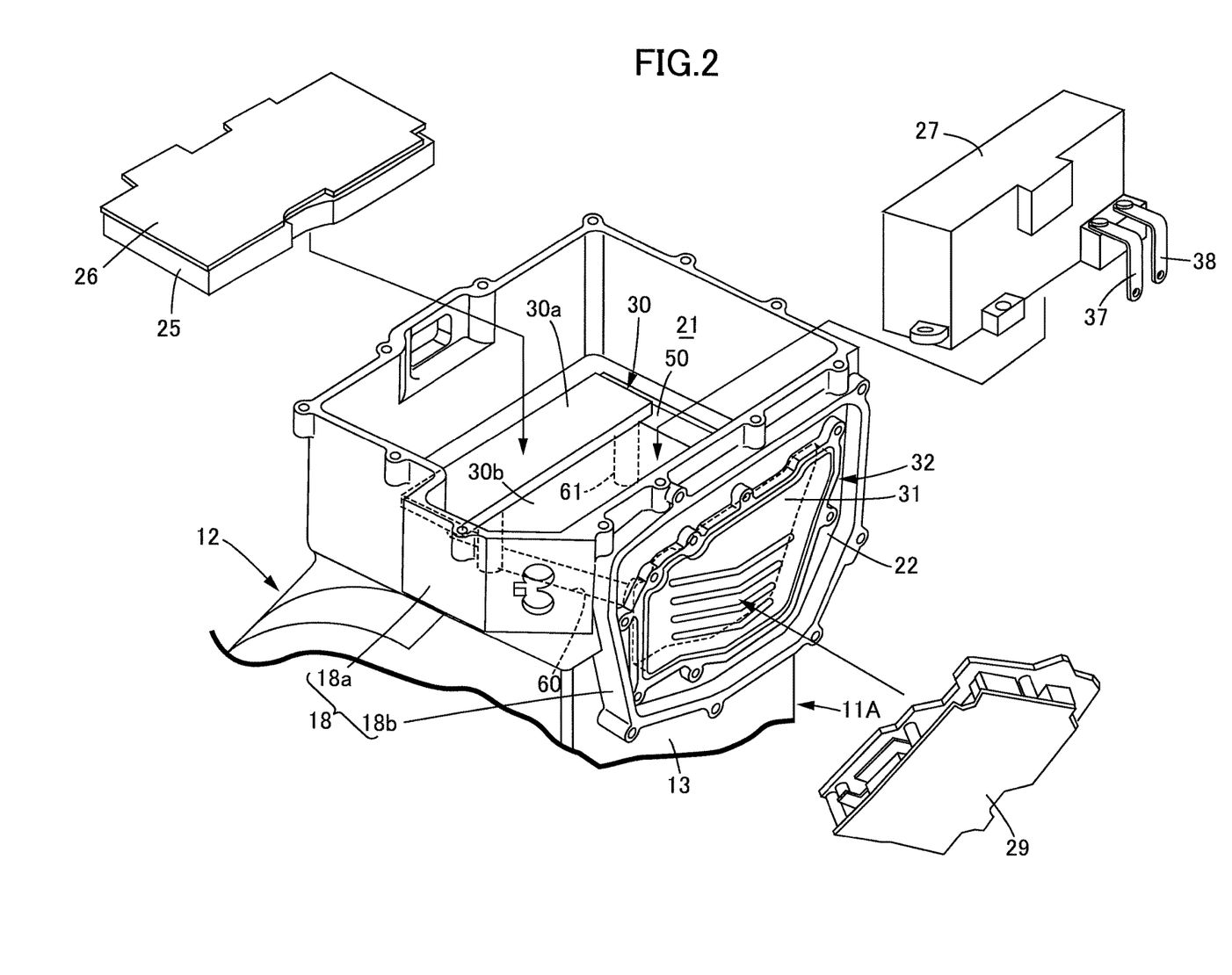
FIG. 2 is an exploded perspective view of an essential part in a state in which an upper lid member and a side lid member are detached from a box body.

Referring in addition to FIG. 2, housed in the first housing chamber 21 is the power drive unit 28, which has a power module 25 having a group of semiconductor elements in charge of converting electric power, an ECU 26 controlling the power module 25, and a capacitor module 27 smoothing direct current power between the power module 25 and a battery (not illustrated) of the vehicle, the power drive unit 28 controlling the operation of the motor generator 11A by the electric power conversion of the power module 25. Housed in the second housing chamber 22 is a voltage converter 29 that steps down the direct current power and supplies it to the ECU 26, etc.

Mounted on a bottom part of the box body main portion 18a (that is, an upper wall of the casing 13 in this embodiment) is a first cooling jacket 30 that has a cooling liquid passage portion 30a having on its lower face a cooling liquid inlet and cooling liquid outlet that allow cooling liquid to flow, and that has a mounting portion 30b connected to the cooling liquid passage portion 30a. The power module 25 is mounted on the cooling liquid passage portion 30a of the first cooling jacket 30, and the ECU 26 is disposed on the power module 25. The capacitor module 27 is mounted on the mounting portion 30b of the first cooling jacket 30.

Mounted on the box body remainder portion 18b is a metal thin plate-shaped heat-dissipating lid body 31 defining part of the second housing chamber 22. A second cooling jacket 32 is formed from the heat-dissipating lid body 31 and the box body remainder portion 18b, the second housing chamber 22 housing the second cooling jacket 32. The voltage converter 29 is housed within the second housing chamber 22 while being in contact with the heat-dissipating lid body 31 and fixed to the heat-dissipating lid body 31.

Figure 1:
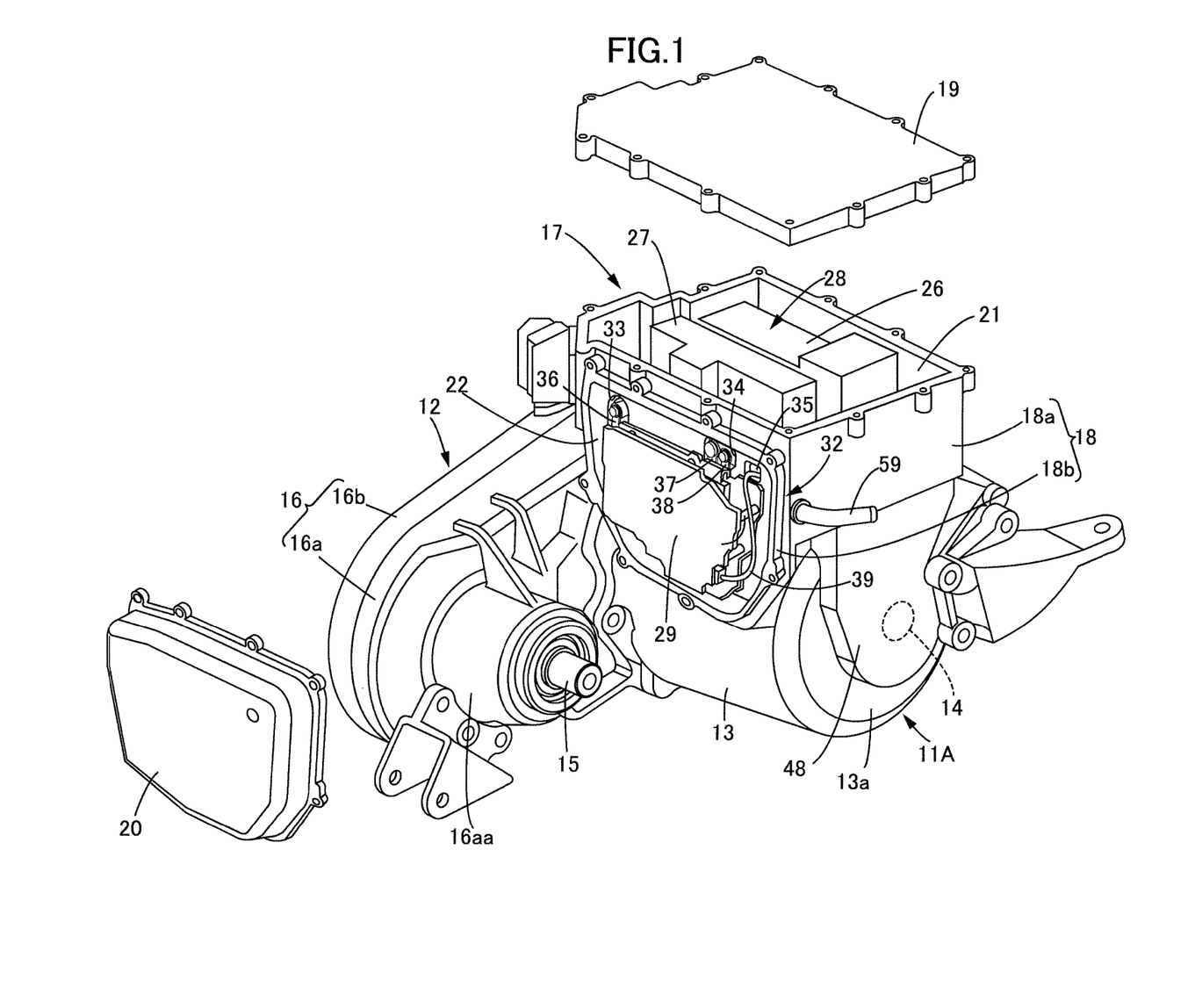
FIG. 1 is an exploded perspective view of a drive device for an electric automobile of a first embodiment.

Focusing on FIG. 1, in a portion of a side wall of the box body main portion 18a, which separates the first housing chamber 21 from the second housing chamber 22 above the second cooling jacket 32, first, second, and third openings 33, 34, 35 are provided, the first housing chamber 21 and the second housing chamber 22 being communicated with each other via the first, second, and third openings 33, 34, 35, the first, second, and third openings 33, 34, 35 being provided, at intervals, in sequence from the transmission 12 side in the rotational axis direction of the motor generator 11A.

Inserted through the first opening 33 is a 12V power supply bus bar 36 providing a connection between the voltage converter 29 and a power source positive side terminal that is connected to the battery, which is not illustrated, and is provided on the casing 13. Inserted through the second opening 34 are a pair of high voltage bus bars 37, 38 providing a connection between the voltage converter 29 and the capacitor module 27 housed within the first housing chamber 21. Furthermore, inserted through the third opening 35 is a lead wire 39 supplying 12V electric power from the voltage converter 29 to the ECU 26 housed in the first housing chamber 21.

In FIG. 3, a stator terminal block 40 of the motor generator 11A is provided on an end wall 13a of the casing 13 and a resolver 41 as a rotation angle detection device detecting the rotational state of the rotating shaft 14 is mounted thereon, these being on either end side in the axial direction of the rotating shaft 14 of the electric motor 11A, in this embodiment on the other end side in the axial direction of the rotating shaft 14 having one end part operatively linked to the reduction gear mechanism of the transmission 12. Mounted on the stator terminal block 40 are three-phase power wires 45, 46, 47 together with three-phase lead wires 42, 43, 44. Mounted on the end wall 13a is a terminal cover 48 covering the resolver 41 and the other end part of the rotating shaft 14 in the axial direction, and formed between the terminal cover 48 and the end wall 13a of the casing 13 is a third housing chamber 49 housing the stator terminal block 40 and the resolver 41.

On the other end side in the axial direction of the rotating shaft 14, a fourth opening 50 providing communication between the third housing chamber 49 and the first housing chamber 21 is provided in an upper wall of the casing 13, and the power wires 45, 46, 47, which are formed into a flat band shape, and a signal wire 51 connected to the resolver 41 extend through the fourth opening 50 and are introduced into the first housing chamber 21 of the housing box 17.

A terminal retaining member 52 covering part of the opening 50 on the box body side is mounted on a bottom part of the box body main portion 18a, and the power wires 45 to 47 extending through the fourth opening 50 extend further through the terminal retaining member 52 and are fixed onto the terminal retaining member 52.

Figure 4:
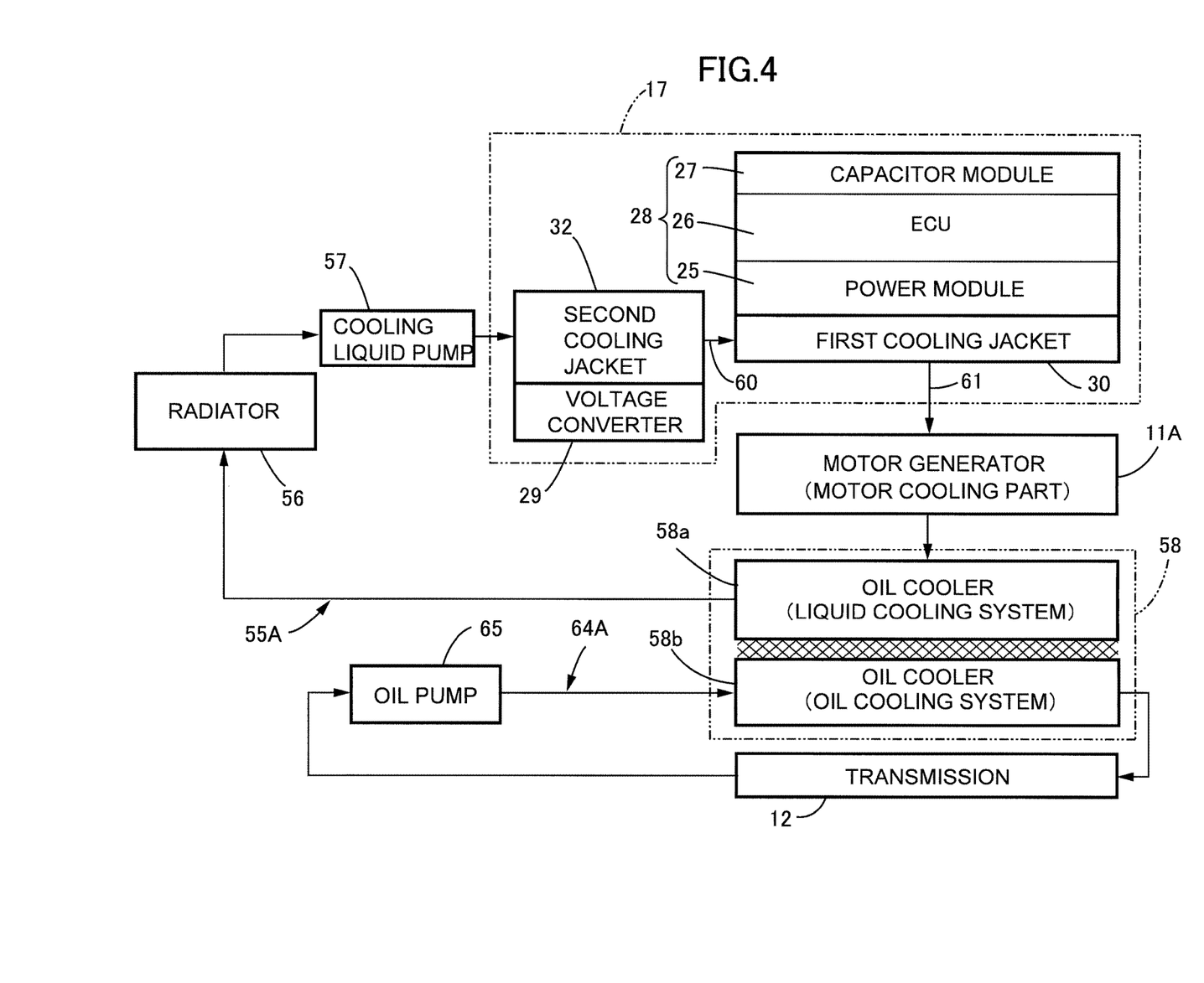
FIG. 4 is a systematic diagram of a cooling system.

Referring in addition to FIG. 4, the first cooling jacket 30 and the second cooling jacket 32 form part of a liquid cooling system 55A that cools the motor generator 11A, the power drive unit 28, and the voltage converter 29. The liquid cooling system 55A is formed from: a radiator 56; a cooling liquid pump 57 that sucks in a cooling liquid such as an antifreeze from the radiator 56; the second cooling jacket 32, to which cooling liquid from the cooling liquid pump 57 is introduced; the first cooling jacket 30, to which cooling liquid from the second cooling jacket 32 is fed; the motor cooling part (not illustrated) provided within the casing 13 of the motor generator 11A; and one portion 58a of an oil cooler 58 that is connected to the motor cooling part and is provided within the casing 13.

A cooling liquid-introducing pipe 59 is provided on a wall face of the box body main portion 18a of the box body 18 on the other end side in the axial direction of the rotating shaft 14, the cooling liquid-introducing pipe 59 receiving cooling liquid from the cooling liquid pump 57 and supplying it to the second cooling jacket 32. A passage 60 for guiding cooling liquid from the second cooling jacket 32 to the first cooling jacket 30 and a guide pipe 61 provided in an upper part of the casing 13 in order to guide cooling liquid to the motor cooling part within the casing 13 are molded integrally with a bottom part of the box body main portion 18a and the box body remainder portion 18b as a hollow shape. The passage 60 and the guide pipe 61 are liquid-tightly connected to the cooling liquid passage portion 30a of the first cooling jacket 30. Furthermore, on the side opposite to the box body remainder portion 18b with respect to the axis of the rotating shaft 14, a cooling liquid-guide out pipe 62 (see FIG. 3) guiding out cooling liquid from the motor cooling part and guiding the cooling liquid toward the radiator 56 side is provided on a side wall of the casing 13.

The oil cooler 58, which is disposed within the casing 13 of the motor generator 11A so as to be connected to the motor cooling part, is formed from the one portion 58a, which is included in the liquid cooling system 55A, and an other portion 58b through which flows oil that undergoes heat exchange with the cooling liquid of the liquid cooling system 55A. The other portion 58b of the oil cooler 58 is included in an oil cooling system 64A cooling the transmission 12 with an oil spray, etc., the oil cooling system 64A being formed from: an oil pump 65 housed within the transmission case 16 of the transmission 12 while being immersed in oil stored in the transmission case 16; the other portion 58*b* of the oil cooler 58, to which oil pumped up by the oil pump 65 is supplied; and an oil spray part (not illustrated) of the transmission 12 to which oil that has undergone heat exchange with the cooling liquid in the other portion 58*b* is supplied. Oil that has been scattered by the oil spray part and built up within the transmission case 16 of the transmission 12 is pumped up by the oil pump 65.

The operation of the first embodiment is now explained. The power drive unit 28 controlling the operation of the motor generator 11A and the voltage converter 29 are housed in the single housing box 17. The housing box 17 includes: the box body 18 formed from the box body main portion 18*a* disposed above the casing 13 of the motor generator 11A and forming the upper open end part opening upwardly and the box body remainder portion 18*b* forming the side open end part opening sidewardly, connected integrally to the side wall of the box body main portion 18*a* and extending downwardly to the side of the casing 13; the upper lid member 19 mounted on the upper open end part of the box body main portion 18*a*, the first housing chamber 21 being defined between the box body main portion 18*a* and the upper lid member 19, the first housing chamber 21 housing the power drive unit 28; and the side lid member 20 mounted on the side open end part of the box body remainder portion 18*b*, the second housing chamber 22 being defined between the box body remainder portion 18*b* and the side lid member 20, the second housing chamber 22 housing the voltage converter 29. Therefore, the power drive unit 28 and the voltage converter 29 are disposed in a dispersed manner above the motor generator 11A and to the side of the motor generator 11A, thus making it possible to minimize the overall height, including the motor generator 11A, in a state in which the housing box 17 is mounted on the casing 13 of the motor generator 11A and, moreover, since the power drive unit 28 and the voltage converter 29 are housed within the single housing box 17, any increase in the number of components is suppressed.

Furthermore, the second cooling jacket 32 is formed from the box body remainder portion 18*b* and the heat-dissipating lid body 31 defining part of the second housing chamber 22 and mounted on the box body remainder portion 18*b*, and the voltage converter 29 is housed within the second housing chamber 22 so as to be in contact with the heat-dissipating lid body 31. Therefore, the power drive unit 28, the voltage converter 29, and the second cooling jacket 32 can be efficiently housed within the single housing box 17 without increasing the overall height of the power conversion device, thus enabling the voltage converter 29 to be efficiently cooled.

Moreover, due to the box body 18 being formed by die-cast integrated molding with the casing 13, the upper wall of the casing 13 serves as the bottom part of the first housing chamber 21 housing the power drive unit 28, and it is possible to omit fastening screws, air-tight members, etc., thus suppressing any increase in the number of components and enabling the weight of the power conversion device including the motor generator 11A to be lightened.

Furthermore, the first, second, and third openings 33, 34, 35 providing communication between the first housing chamber 21 and the second housing chamber 22 are provided in a portion of the side wall of the box body main portion 18*a* that separates the first housing chamber 21 from the second housing chamber 22 above the second cooling jacket 32, and current carrying members such as the power supply bus bar 36, the pair of high voltage bus bars 37, 38, and the lead wire 39 are inserted through these openings 33 to 35, the power supply bus bar 36 supplying electric power to the voltage converter 29, the pair of high voltage bus bars 37, 38 providing a connection between the capacitor module 27 and the voltage converter 29, and the lead wire 39 providing a connection between the voltage converter 29 and the ECU 26. Therefore, it is possible to prevent these current carrying members from being exposed outside the housing box 17, thus lessening waterproof couplers, etc. and thereby reducing the cost.

Moreover, since the stator terminal block 40 of the motor generator 11A is provided on the end wall 13*a* of the casing 13, the resolver 41 detecting the rotational state of the rotating shaft 14 is mounted on the end wall 13*a* of the casing 13, the fourth opening 50 communicating with the first housing chamber 21 is provided in the upper wall of the casing 13 close to the end wall 13*a* in the axial direction of the rotating shaft 14, and the power wires 45, 46, 47 mounted on the stator terminal block 40 together with the three-phase lead wires 42, 43, 44 and the signal wire 51 connected to the resolver 41 extend through the fourth opening 50 and are introduced into the first housing chamber 21, it is possible to prevent the high voltage power wires 45 to 47 from being exposed to the outside and to enhance the safety by making it difficult for unforeseen electrical leakage to occur under circumstances in which the electric automobile is involved in a collision, and due to the necessity for a waterproof coupler, etc. being eliminated, the cost can be reduced.

Furthermore, since at least a part of the transmission 12 operatively linked to the rotating shaft 14 of the motor generator 11A is disposed to the side of the casing 13 so that the axis of the output shaft 15 of the transmission 12 is parallel to the rotational axis of the motor generator 11A, and the box body remainder portion 18*b* and the side lid member 20 are disposed between the casing 13 and the part of the transmission 12 when viewed from above, in spite of the voltage converter 29 being disposed to the side of the motor generator 11A it is possible to make the mechano-electrical integrated drive device compact.

Figure 5:
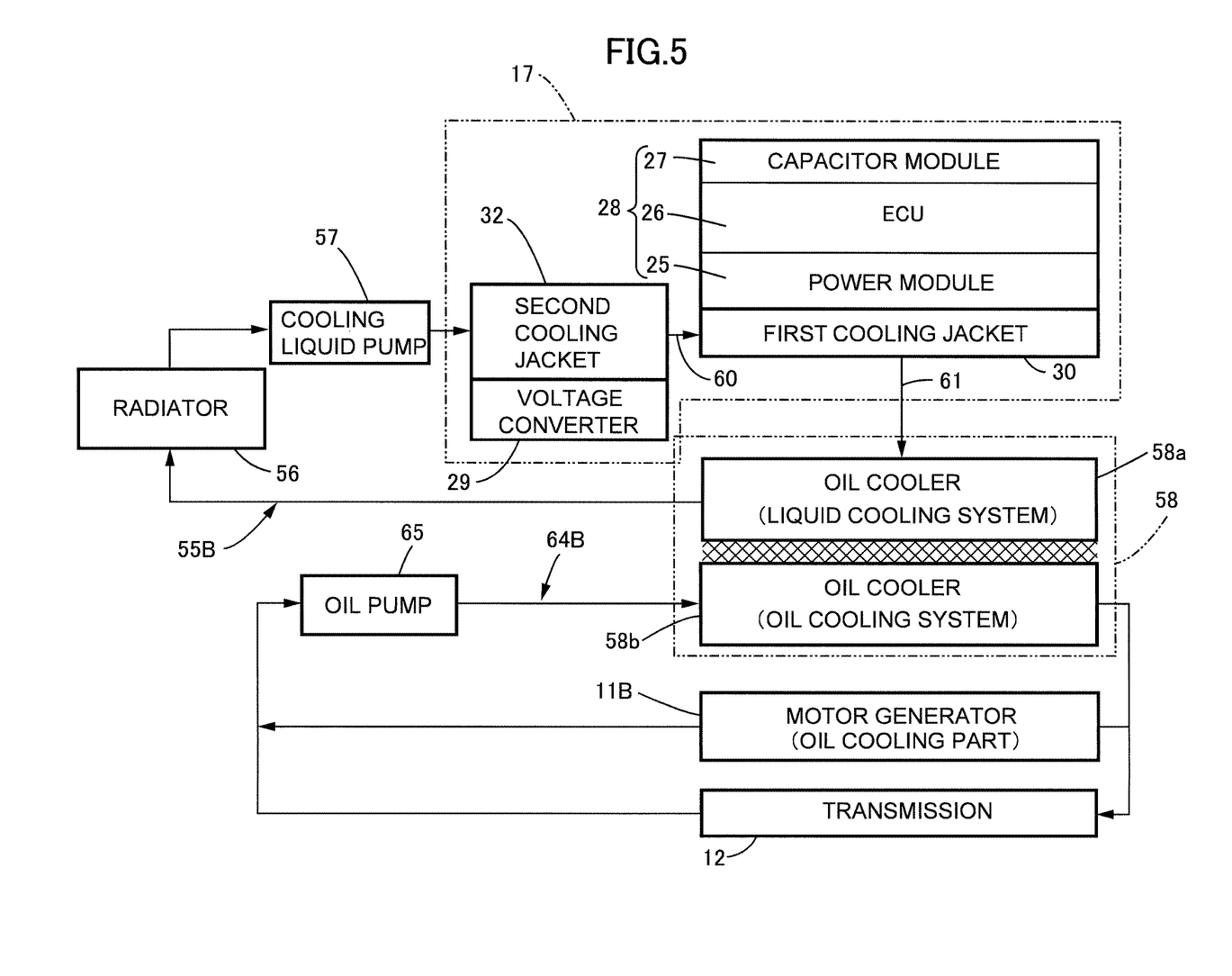
FIG. 5 is a systematic diagram of a cooling system of a second embodiment.

A second embodiment of the present invention is now explained by reference to FIG. 5; parts corresponding to those of the first embodiment are denoted by the same reference numerals and symbols and illustrated only, detailed explanation thereof being omitted.

The first cooling jacket 30 and the second cooling jacket 32 form part of a liquid cooling system 55B for cooling the power drive unit 28 and the voltage converter 29, the liquid cooling system 55B being formed from: the radiator 56; the cooling liquid pump 57 sucking in cooling liquid such as antifreeze from the radiator 56; the second cooling jacket 32, to which cooling liquid from the cooling liquid pump 57 is introduced; the first cooling jacket 30, to which cooling liquid from the second cooling jacket 32 is fed; and the one portion 58*a* of the oil cooler 58, to which cooling liquid is fed from the first cooling jacket 30 and from which cooling liquid is returned to the radiator 56.

The oil cooler 58 is formed from the one portion 58*a* included in the liquid cooling system 55B and the other portion 58*b* through which is made to flow oil carrying out heat exchange with cooling liquid of the liquid cooling system 55B. The other portion 58*b* of the oil cooler 58 is included in an oil cooling system 64B for cooling a motor generator 11B and the transmission 12 with an oil spray, etc. The oil cooling system 64B is formed from: the oil pump 65 housed within the transmission case 16 of the transmission 12 while being immersed in oil stored in the transmission case 16; the other portion 58*b* of the oil cooler 58, to which oil pumped up by the oil pump 65 is supplied; and an oil cooling part (not illustrated) of the motor generator 11B and an oil spray part (not illustrated) of the transmission 12, to which the oil that has undergone heat exchange with cooling liquid in the other portion 58b is supplied. Oil that has passed through the oil cooling part (not illustrated) and the oil spray part and built up within the transmission case 16 of the transmission 12 is pumped up by the oil pump 65 and supplied to the other portion 58b of the oil cooler 58.

In accordance with this second embodiment also, the same effects as those of the first embodiment can be exhibited.

Embodiments of the present invention are explained above, but the present invention is not limited to the above-mentioned embodiments and may be modified in a variety of ways as long as the modifications do not depart from the gist of the present invention.

What is claimed is:

1. A mechano-electrical integrated power conversion device comprising a voltage converter and a power drive unit that controls operation of an electric motor, the voltage converter and the power drive unit being housed in an interior of a single housing box and formed as a module,
   wherein the housing box comprises a box body, an upper lid member, and a side lid member, the box body including a box body main portion and a box body remainder portion, the box body main portion being disposed above a casing of the electric motor and forming an upper open end part opening upwardly, the box body remainder portion forming a side open end part opening sidewardly and being connected integrally to a side wall of the box body main portion so as to extend downwardly to a side of the casing,
   the upper lid member being mounted on the upper open end part of the box body main portion and a first housing chamber being defined between the box body main portion and the upper lid member, the first housing chamber housing the power drive unit, and
   the side lid member being mounted on the side open end part of the box body remainder portion and a second housing chamber being defined between the box body remainder portion and the side lid member, the second housing chamber housing the voltage converter.

2. The mechano-electrical integrated power conversion device according to claim 1, wherein
   a cooling jacket comprises the box body remainder portion and a heat-dissipating lid body mounted on the box body remainder portion so as to partition off part of the second housing chamber, and
   the voltage converter is housed within the second housing chamber so as to be in contact with the heat-dissipating lid body.

3. The mechano-electrical integrated power conversion device according to claim 1, wherein the box body main portion and the box body remainder portion are formed by die-cast integrated molding with the casing.

4. The mechano-electrical integrated power conversion device according to claim 3, wherein
   a stator terminal block of the electric motor is provided on, and a rotation angle detection device detecting a rotational state of a rotating shaft of the electric motor is mounted on, an end wall of the casing on one end side in an axial direction of the rotating shaft,
   an opening communicating with the first housing chamber is provided in an upper wall of the casing close to the end wall in the axial direction of the rotating shaft, and
   power wires and a signal wire extend through the opening and are guided into the first housing chamber, the power wires being mounted on the stator terminal block together with three-phase lead wires and the signal wire being connected to the rotation angle detection device.

5. A drive device for an electric automobile, comprising as a drive source the mechano-electrical integrated power conversion device according to claim 1; and the electric motor, wherein
   the electric motor is driven by the mechano-electrical integrated power conversion device;
   at least a part of a transmission operatively linked to the rotating shaft of the electric motor is disposed in parallel to the side of the casing so that an axis of an output shaft of the transmission is parallel to a rotational axis of the electric motor, and the box body remainder portion and the side lid member are disposed between the casing and the part of the transmission when viewed from above.

* * * * *